(12) United States Patent
Tanaka et al.

(10) Patent No.: US 8,222,107 B2
(45) Date of Patent: Jul. 17, 2012

(54) METHOD FOR PRODUCING SEMICONDUCTOR ELEMENT

(75) Inventors: Koutarou Tanaka, Osaka (JP);
Masahiko Niwayama, Kyoto (JP);
Masao Uchida, Osaka (JP)

(73) Assignee: Panasonic Corporation, Osaka (JP)

( * ) Notice: Subject to any disclaimer, the term of this patent is extended or adjusted under 35 U.S.C. 154(b) by 2 days.

(21) Appl. No.: 13/126,112

(22) PCT Filed: Jul. 28, 2010

(86) PCT No.: PCT/JP2010/004785
§ 371 (c)(1),
(2), (4) Date: Apr. 26, 2011

(87) PCT Pub. No.: WO2011/013364
PCT Pub. Date: Feb. 3, 2011

(65) Prior Publication Data
US 2011/0207275 A1      Aug. 25, 2011

(30) Foreign Application Priority Data

Jul. 28, 2009   (JP) .................................. 2009-175021

(51) Int. Cl.
*H01L 21/336* (2006.01)
(52) U.S. Cl. ................................. 438/268; 257/E21.41
(58) Field of Classification Search .................. 438/268; 257/E21.41
See application file for complete search history.

(56) References Cited

U.S. PATENT DOCUMENTS

| | | | |
|---|---|---|---|
| 5,976,936 A | 11/1999 | Miyajima et al. | |
| 7,531,396 B2 * | 5/2009 | Hayashi et al. | 438/172 |
| 2009/0101918 A1 | 4/2009 | Uchida et al. | |
| 2010/0048004 A1 | 2/2010 | Hashimoto et al. | |
| 2010/0221917 A1 | 9/2010 | Masuda | |

FOREIGN PATENT DOCUMENTS

| | | |
|---|---|---|
| JP | 03-239371 A | 10/1991 |
| JP | 04-207038 A | 7/1992 |
| JP | 11-266017 A | 9/1999 |
| JP | 2000-040817 A | 2/2000 |
| JP | 2002-299620 A | 10/2002 |
| JP | 2006-032411 A | 2/2006 |
| WO | 2007/086196 A1 | 8/2007 |
| WO | 2007/135940 A1 | 11/2007 |
| WO | 2008/087763 A1 | 7/2008 |

OTHER PUBLICATIONS

International Search Report for corresponding International Application No. PCT/JP2010/004785 mailed Oct. 26, 2010.
Form PCT/ISA/237 for International Application No. PCT/JP2010/004785 dated Oct. 26, 2010 and partial English translation.

* cited by examiner

*Primary Examiner* — Seahvosh Nikmanesh
(74) *Attorney, Agent, or Firm* — Renner, Otto, Boisselle & Sklar, LLP

(57) ABSTRACT

A method of producing a semiconductor device according to the present invention includes: a step of implanting an impurity into a semiconductor layer 2 by using a first implantation mask layer 30, thereby forming a body region 6; a step of implanting an impurity by using the first implantation mask layer 30 and a second implantation mask layer 31, thereby forming a contact region 7 within the body region 6; a step of forming a third implantation mask layer 32, and thereafter selectively removing the second implantation mask layer 31; a step of forming a side wall 34 on a side face of the first implantation mask layer 30; and a step of implanting an impurity to form a source region 8 within the body region 6.

6 Claims, 12 Drawing Sheets

(a)

Ws=Wsa+Wsb (b)

US 8,222,107 B2

METHOD FOR PRODUCING SEMICONDUCTOR ELEMENT

TECHNICAL FIELD

The present invention relates to a method of producing a semiconductor device. In particular, it relates to a power semiconductor device in which silicon carbide is used for high breakdown voltage or large current usage.

BACKGROUND ART

Silicon carbide (SiC) is a semiconductor material with a high hardness which has a greater band gap than that of silicon (Si), and is applied in various semiconductor devices such as power devices, environment resistant devices, high-temperature operating devices, and high-frequency devices. Among others, applications to power devices such as switching devices and rectifier devices are drawing attention. A power device in which SiC is used has an advantage of e.g. a greatly reduced power loss than that of an Si power device.

Among power devices in which SiC is used, representative switching devices are metal-insulator-semiconductor field effect transistor (hereinafter abbreviate as MISFETs) and metal-semiconductor field effect transistors (MISFET). In such switching devices, based on a voltage which is applied to the gate electrode, it is possible to switch between an ON state where a drain current of several A (ampere) or more flows and an OFF state where there is zero drain current. Moreover, with SiC, a high breakdown voltage of several hundred V or more can be realized in the OFF state.

A switching device structure using SiC is proposed in Patent Document 1, for example. Hereinafter, with reference to the drawings, the structure of a vertical MISFET which is proposed in this document will be described.

FIG. 10 is a cross-sectional view illustrating an exemplary vertical MISFET.

In an SiC layer 102 which is formed on an SiC substrate 101, a drift region 102a, p type body (well) regions 106, source regions 108, and contact regions 107 are formed. Between adjoining body regions 106 on the surface of the SiC layer 102, a channel layer 103 is formed. On the channel layer 103, a gate electrode 110 is provided via a gate insulating film 104. The gate electrode 110 is covered by an interlayer insulating film 111. Each source region 108 and each contact region 107 are electrically connected to a source electrode 109 which is provided on the SiC layer 102. Through a contact hole which is formed in the interlayer insulating film 111, the source electrode 109 is electrically connected to upper wiring 112 provided on the interlayer insulating film 111. On the other hand, a drain electrode 105 is formed on the rear face of the SiC substrate 101. In an SiC power MISFET as shown in FIG. 10, the drift resistance can be greatly decreased because the thickness of the SiC layer 102 is reduced.

A method of producing the SiC power MISFET shown in FIG. 10 is disclosed in Patent Document 2, for example. FIG. 11(a) to (e) are cross-sectional views showing the production steps disclosed in Patent Document 2. Note that an MISFET is typically composed of a multitude of unit cells which are arrayed on a substrate, each unit cell being defined by a body region. FIG. 11(a) to (e) show portions of adjoining unit cells among such unit cells.

First, as shown in FIG. 11(a), after forming an $SiO_2$ layer 324 on an SiC layer 302 which is grown on a substrate (not shown), by using this as a mask, impurity ions are implanted into the SiC layer 302. As a result, a plurality of body regions 306 are formed in the SiC layer 302, such that any region of the SiC layer 302 where the body regions 306 were not formed becomes a drift region 302a.

Next, as shown in FIG. 11(b), a side wall 325 which is in contact with a lateral wall of the $SiO_2$ layer 324 and a resist layer 323 covering a portion of each body region 306 are formed. Specifically, an $SiO_2$ film (not shown) is deposited on the substrate surface on which the $SiO_2$ layer 324 has been formed, and this is etched back to obtain the side wall 325. Next, after forming a resist film (not shown) on the substrate surface, this is patterned to form the resist layer 323. In a portion of the body region 306 that is covered by the resist layer 323, a contact region is to be formed in a subsequent step.

Next, as shown in FIG. 11(c), by using the $SiO_2$ layer 324, the side wall 325, and the resist layer 323 as masks, impurity implantation in the SiC layer 302 is performed, whereby the source regions 308 are obtained. A distance Lg between an end of a body region 306 and an end of a source region 308 on the surface of the SiC layer 302 defines a "gate length" of the MISFET. After the implantation, the $SiO_2$ layer 324, the side wall 325, and the resist layer 323, which were used as the masks, are removed.

Next, as shown in FIG. 11(d), a resist film 326 covering the substrate surface is applied over the SiC layer 302. Thereafter, through a known exposure and development process, the resist film 326 is patterned, thereby forming an opening 326a in a portion of each body region 306 where a contact region is to be formed.

Next, as shown in FIG. 11(e), p type impurity ions are implanted into the SiC layer 302 by using the resist layer 326 as an implantation mask, whereby a contact region 307 is obtained inside each body region 306.

CITATION LIST

Patent Literature

[Patent Document 1] Japanese Laid-Open Patent Publication No. 11-266017
[Patent Document 2] A pamphlet of International Publication No. 2008/087763
[Patent Document 3] A pamphlet of International Publication No. 2007/135940

SUMMARY OF INVENTION

Technical Problem

In the method of Patent Document 2, the resist layer 326 having the openings 326a for forming the contact regions 307 is newly formed at the step shown in FIG. 11(d). At this step, misalignment in the photolithography step may occur. Misalignment refers to a deviation of the actual position from a designed position of a region where an impurity is to be implanted, etc., that is caused by a deviation in the position of a photomask relative to a resist film. Hereinafter, this problem will be described with reference to FIGS. 12(a) and (b).

At the step shown in FIG. 12(a), the resist layer 326 for forming a contact region 307 is applied on the SiC layer 302. Thereafter, the resist film 326 is patterned through a known exposure and development process. In the case where the center of an opening 326a to be formed in the resist film 326 is set at a position P1, if a misalignment Δx occurs in the photolithography step, the center of the opening 326a will be at a position P2.

Next, as shown in FIG. 12(b), a contact region 307' which is formed by using the resist film 326 as an implantation mask will be formed at a position that is deviated by Δx from the position where it should have been formed. At this time, an overlap occurs between the source region 308 and the contact region 307'. Since the source region 308 contains an n type impurity and the contact region 307' contains a p type impurity, the portion where the source region 308 and the contact region 307' are overlapping will not function effectively. As a result, the p type conducting plane in the contact region 307' decreases in surface area, thus making it difficult for the body region 306 to achieve contact. Moreover, since the source region 308 decreases in area and the n type conducting plane in the contact region 307' decreases in surface area, the ON resistance is increased and the ON current is decreased. Thus, because the ON resistance value is affected by the degree of misalignment, variation in ON resistance occurs between MISFET products due to misalignment, thus resulting in a problem of not being able to obtain high reliability.

So long as known exposure apparatuses are used, it is very difficult to prevent misalignment completely. For example, a misalignment on the order of 1 to 2 μm may occur when a contact aligner is used, and a misalignment on the order of 0.1 to 0.2 μm may occur when a stepper is used.

Patent Document 3 states that, even if a misalignment in the conducting plane of the source electrode occurs, by providing a margin for the unit cell in a direction in which misalignment is likely to occur, deteriorations in the device characteristics can be suppressed even if a misalignment occur. However, Patent Document 3 fails to disclose a method which forms all of the body region, the source region, and the p$^+$ type contact region in a self-aligning manner.

The present invention has been made in view of the above circumstances, and a main objective thereof is to, by improving the controllability of photolithography after formation of body regions, suppress deterioration and variation in device characteristics that are associated with a misalignment in photolithography.

Solution to Problem

A semiconductor device according to the present invention comprises: a first semiconductor layer of a first conductivity type; a second conductivity-type semiconductor region provided in a surface region of the first semiconductor layer; a second conductivity type high-concentration region provided within the second conductivity-type semiconductor region; a first conductivity-type semiconductor region provided within the second conductivity-type semiconductor region; and an electrically conductive layer being provided on a surface of the first semiconductor layer and in contact with the first conductivity-type semiconductor region and the second conductivity type high-concentration region, wherein, at any arbitrary depth of the first semiconductor layer, the first conductivity-type semiconductor region surrounds the second conductivity type high-concentration region at a predetermined interval from the second conductivity type high-concentration region; and a portion of the second conductivity-type semiconductor region is located in a region between the second conductivity type high-concentration region and the first conductivity-type semiconductor region.

In one embodiment, the first semiconductor layer is made of silicon carbide.

In one embodiment, the semiconductor device further comprises: a semiconductor substrate having the first semiconductor layer on a principal face thereof; a second semiconductor layer formed on a portion of the first conductivity-type semiconductor region, a portion of the second conductivity-type semiconductor region that surrounds a periphery of the first conductivity-type semiconductor region, and a portion of the first semiconductor layer that is located outside the second conductivity-type semiconductor region; a gate insulating film formed on the second semiconductor layer; a gate electrode formed on the gate insulating film; an upper wiring electrode electrically connected to the electrically conductive layer; and a drain electrode formed on a rear face of the semiconductor substrate.

In one embodiment, at the surface of the first semiconductor layer, the second conductivity type high-concentration region and the first conductivity-type semiconductor region are shifted by the same distance and in the same direction from a center of the second conductivity-type semiconductor region.

A method of producing a semiconductor device according to the present invention comprises: step (a) of implanting an impurity of a second conductivity type into a first semiconductor layer of a first conductivity type by using a first implantation mask layer, thereby forming a second conductivity-type semiconductor region in a surface region of the first semiconductor layer; step (b) of forming a second implantation mask layer covering the first implantation mask layer and the first semiconductor layer and having an opening for exposing a portion of the second conductivity-type semiconductor region, and implanting an impurity of the second conductivity type by using the first implantation mask layer and the second implantation mask layer, thereby forming within the second conductivity-type semiconductor region a second conductivity type high-concentration region having a higher concentration than an impurity concentration in the second conductivity-type semiconductor region; step (c) of forming a third implantation mask layer burying the opening, and thereafter selectively removing the second implantation mask layer; step (d) of forming a fourth implantation mask layer on a side face of the first implantation mask layer; step (e) of implanting an impurity of the first conductivity type by using the first implantation mask layer, the third implantation mask layer, and the fourth implantation mask layer, thereby forming a first conductivity-type semiconductor region within the second conductivity-type semiconductor region; and step (f) of forming an electrically conductive layer in contact with the first conductivity-type semiconductor region and the second conductivity type high-concentration region, wherein, at step (e), the first conductivity-type semiconductor region is formed so as to surround the second conductivity type high-concentration region at an interval from an outer periphery of the second conductivity-type semiconductor region at any arbitrary depth of the first semiconductor layer.

In one embodiment, in step (d), the fourth implantation mask layer is formed also on a side face of the third implantation mask layer; and in step (e), a predetermined interval is provided between the first conductivity-type semiconductor region and the second conductivity type high-concentration region at any arbitrary depth of the first semiconductor layer.

In one embodiment, at step (d), side walls are formed on the side faces of the first implantation mask layer and the third implantation mask layer as the fourth implantation mask layer.

In one embodiment, the first, second, and third implantation mask layers are composed of respectively different materials.

One embodiment further comprises: step (g) of, before step (a), forming the first semiconductor layer on a semiconductor substrate; step (h) of forming a second semiconductor layer on a portion of the first conductivity-type semiconductor region, a portion of the second conductivity-type semiconductor region that surrounds a periphery of the first conductivity-type semiconductor region, and a portion of the first semiconductor layer that is located outside the second conductivity-type semiconductor region; step (i) of forming a gate insulating film on the second semiconductor layer; step (j) of forming a gate electrode on the gate insulating film; step (k) of forming an upper wiring electrode to be electrically connected to the electrically conductive layer; and step (l) of forming a rear electrode on a rear face of the semiconductor substrate.

In one embodiment, at step (d), the fourth implantation mask layer is formed also on a side face of the third implantation mask layer, and, before step (e), a step of removing the fourth implantation mask layer formed on the side face of the third implantation mask layer is further comprised.

In one embodiment, at step (d), after forming a mask-making film covering the first implantation mask layer and the third implantation mask layer, anisotropic etching is performed for the mask-making film to form the fourth implantation mask layer while leaving only portions of the mask-making film that are located on the side face of the first implantation mask layer and the side face of the third implantation mask layer.

Advantageous Effects of Invention

According to the present invention, even if a misalignment occurs in a photolithography step, openings (inner edges) of the second conductivity type high-concentration region and the first conductivity-type semiconductor region are shifted by the same distance and in the same direction. Therefore, no overlap between the second conductivity type high-concentration region and the first conductivity-type semiconductor region occurs. This makes it possible to securely achieve contact of the second conductivity-type semiconductor region, and prevent short-circuiting between electrodes and contact insufficiencies.

Moreover, since the effective areas of the first conductivity-type semiconductor region and the second conductivity type high-concentration region are not decreased, the ON resistance is not increased. Moreover, since variation in ON resistance due to misalignment is unlikely to occur between MISFET products, a high reliability is obtained.

DESCRIPTION OF EMBODIMENTS

Figure 1:
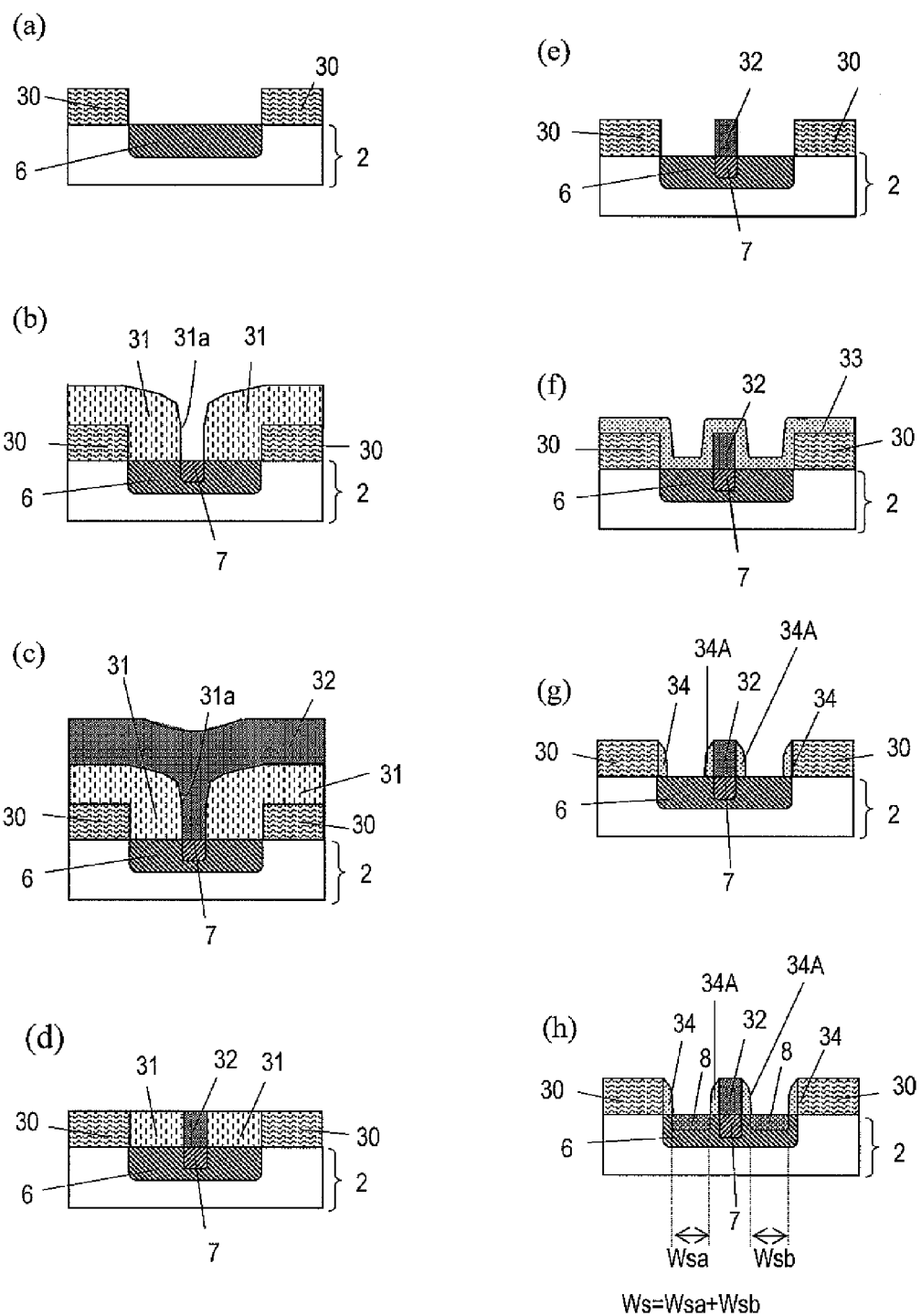
FIG. 1 (*a*) to (*h*) are schematic step-by-step cross-sectional views for describing a method of forming a body region 6, a source region 8, and a contact region 7 according to an embodiment of the present invention.

Hereinafter, preferred embodiments of the present invention will be described with reference to the drawings.

First Embodiment

Hereinafter, with reference to the drawings, a first embodiment of a semiconductor device according to the present invention will be described. In the present embodiment, a fundamental concept and a production method of the present invention will be described.

First, steps for forming a body region, a $p^+$ type contact region, and a source region will be described.

In the following figures, for simplicity of explanation, any component element having substantially the same function will be denoted by the same reference numeral. Note that the present invention is not to be limited to the following embodiments.

First, as shown in FIG. 1(*a*), a p type impurity is implanted into an n type semiconductor layer (which herein is an SiC layer) 2 which is grown on a semiconductor substrate (not shown) by using a first mask layer (which herein is a poly-Si film) 30, thereby forming a p type body region 6 in a surface region of the semiconductor layer 2. Herein, the first mask layer 30 is not limited to a poly-Si film.

Next, as shown in FIG. 1(*b*), a second mask layer (which herein is an $SiO_2$ film) 31 covering the semiconductor layer 2 and the first mask layer 30 is formed, and thereafter a resist film (not shown) is applied so as to cover the second mask layer 31. Thereafter, the resist film is patterned through a known exposure and development process, and an opening 31*a* is formed in a portion of the second mask layer 31 by using the resist film as a mask. The opening 31*a* is formed in such a manner as to expose a portion of the body region 6 where a contact region 7 is to be formed. Next, p type impurity ions are implanted into the semiconductor layer by using the second mask layer 31, thereby forming the contact region 7 inside the body region 6. At this time, since the contact region 7 is formed by further implanting a p type impurity into the p type body region 6, the concentration of the p type impurity in the contact region 7 is higher than the concentration of the p type impurity in the body region 6. The second mask layer 31 may be any substance that is capable of being selectively removed against the first mask layer 30, and is not limited to an $SiO_2$ film.

Next, as shown in FIG. 1(*c*), a third mask layer (which herein is an SiN film) 32 is formed which covers over the semiconductor layer 2 exposed in the opening 31*a* and over the second mask layer 31. Herein, the third mask layer 32 may be any substance that is capable of being selectively removed against the first mask layer 30 and the second mask layer 31, and is not limited to an SiN film.

Next, as shown in FIG. 1(d), through a known CMP step, portions of the second mask layer 31 and the third mask 32 that are located above the upper face of the first mask layer 30 are removed.

Next, as shown in FIG. 1(e), by utilizing a difference in etching rate between the first mask layer 30 and third mask layer 32 and the second mask layer 31, only the second mask layer 31 is selectively etched away. As a result, a portion of the surface of the body region 6 is exposed. Known etchants such as dilute hydrofluoric acid can be used for the etching.

Next, as shown in FIG. 1(f), a sidewall-forming film 33 composed of an $SiO_2$ film or the like is deposited so as to cover the first mask layer 30 and the third mask layer 32. Herein, the sidewall-forming film 33 is not limited to an $SiO_2$ film.

Next, as shown in FIG. 1(g), an anisotropic etching is performed to allow removal of the sidewall-forming film 33 to progress in the depth direction (etch back). As a result of this, by allowing only the portions of the sidewall-forming film 33 that are located on the side faces of the first mask layer 30 and the third mask layer 32 to remain, a side wall 34 is formed on the side face of the first mask layer 30, and a side wall 34A is formed on the side face of the third mask layer 32.

Thereafter, as shown in FIG. 1(h), by using the first mask layer 30, the third mask layer 32, and the side walls 34 and 34A as implantation masks, n type impurity ions are implanted into the semiconductor layer 2, thereby forming a source region 8 inside the body region 6. Then, the first mask layer 30, the third mask layer 32, and the side walls 34 and 34A are completely removed.

At the step shown in FIG. 1(h), impurity ions are implanted with the side wall 34 having been provided on the side face of the first mask layer 30. As a result, the source region 8 is formed at a position within the body region 6 that is distant from an edge (end) of the body region 6 by an interval corresponding to the width of the side wall 34. On the other hand, by implanting impurity ions with the side wall 34A having been provided on the side face of the third mask layer 32, the source region 8 is formed at a position that is distant from the contact region 7 by an interval corresponding to the width of the side wall 34A. Herein, the widths of the side walls 34 and 34A formed in FIG. 1(g) (i.e., the widths along a direction which is parallel to the upper face of the substrate in a cross section shown in FIG. 1(g)) are equal to each other. Therefore, the interval (the width of the side wall 34A) from the contact region 7 to the source region 8 as shown in FIG. 1(h) is equal to the distance (the width of the side wall 34) from the edge (end) of the body region 6 to the source region 8 formed within the body region 6.

Figure 2:
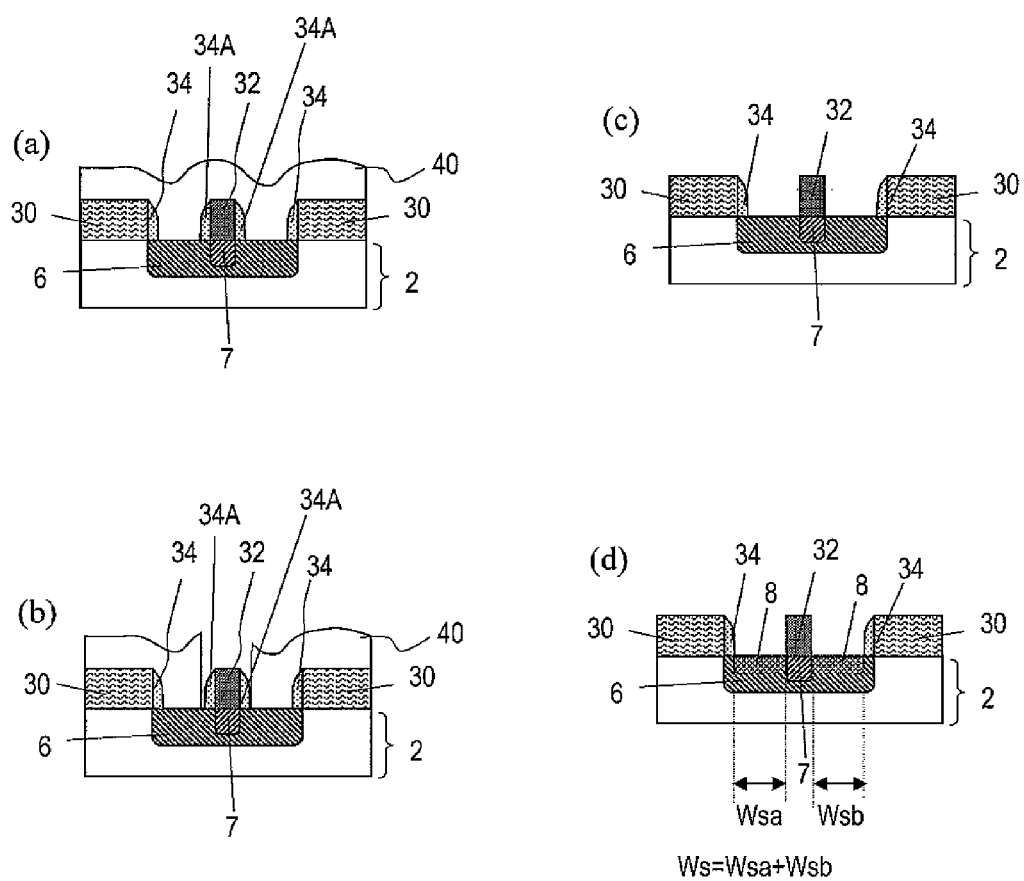
FIG. 2 (*a*) to (*d*) are step-by-step cross-sectional views according to a variant of an embodiment of the present invention.

Note that, in the step shown in FIG. 1(g), the side wall 34A remains on the side face of the third mask layer 32 by performing an etch back for the sidewall-forming film 33. In the present embodiment, the ion implantation for forming the source region 8 may be performed after removing the side wall 34A. In this case, after forming the side walls 34 and 34A at the step shown in FIG. 1(g), a resist mask 40 covering the first mask layer 30, the third mask layer 32, and the side walls 34 and 34A is formed at a step shown in FIG. 2(a). Next, at a step shown in FIG. 2(b), by performing an exposure and development for the resist mask, an opening for exposing the side wall 34A and the third mask layer 32 is formed, for example. Thereafter, as shown in FIG. 2(c), an etching is conducted under conditions that will allow only the side wall 34A to be selectively removed, the side wall 34A is removed. For example, in the case where the side wall 34A is silicon oxide and the third mask layer 32 is silicon nitride, the etching may be performed by using an etchant which allows only the silicon oxide to be selectively removed (e.g., dilute hydrofluoric acid). Thereafter, by performing an ion implantation as shown in FIG. 2(d), the source region 8 is formed. With this method, since the ion implantation is performed after the side wall 34A is removed, the contact region 7 and the source region 8 are formed so as to be in contact with each other. In this case, the area of the source region 8 (i.e., the area as viewed from a direction which is perpendicular to a principal face of the semiconductor layer 2) can be increased as compared to the case where the side wall 34A is formed on the side face of the third mask layer 32.

Figure 3:
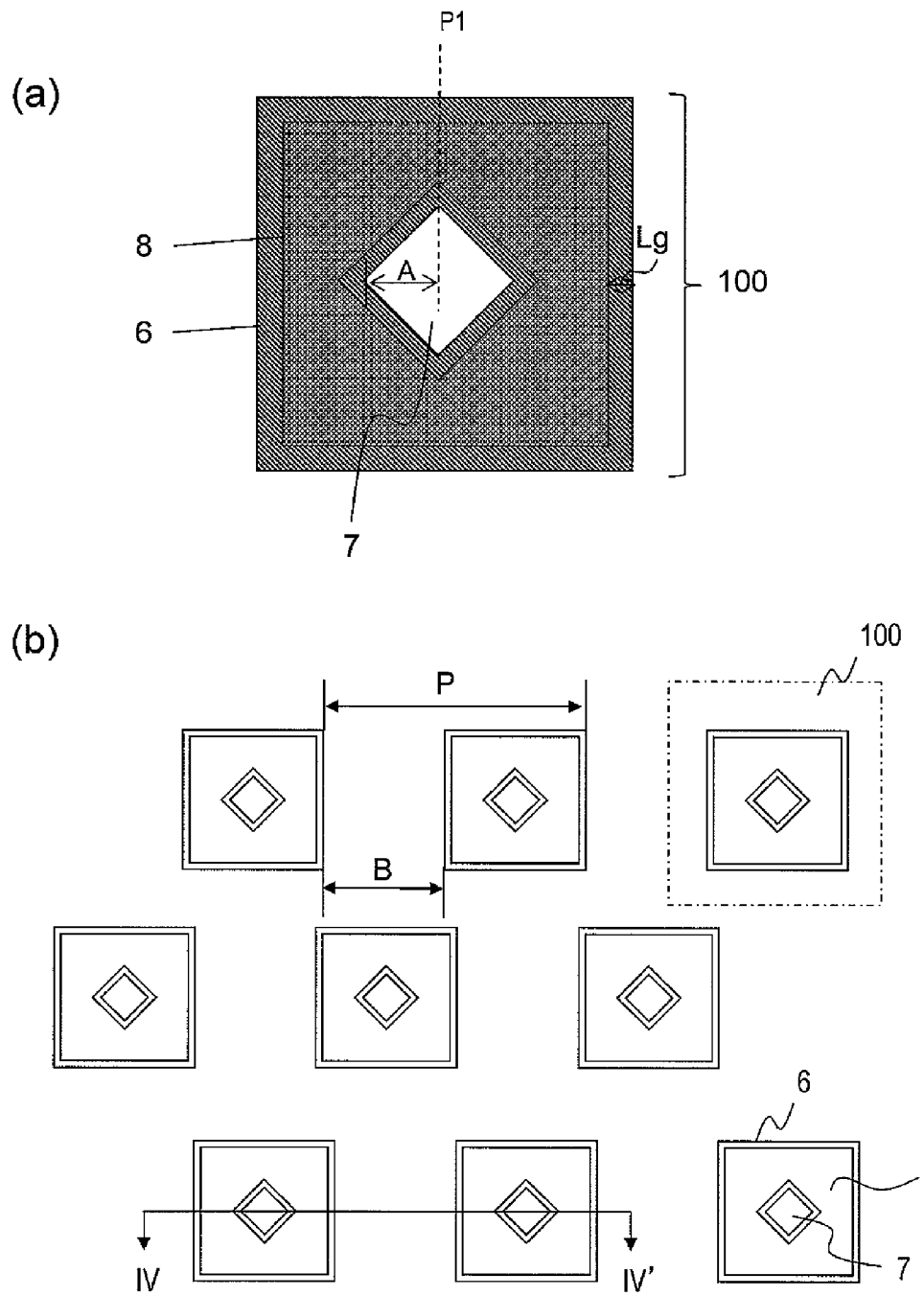
FIG. 3 (*a*) is a diagram showing a unit cell 100 as viewed from a direction which is perpendicular to a principal face of the semiconductor layer 2; and (*b*) is a diagram showing a vertical MISFET in which unit cells 100 are integrated.

FIG. 3(a) shows a unit cell 100 as viewed from a direction which is perpendicular to the principal face of the semiconductor layer 2. The planar shape of the body region 6 as viewed from a direction which is perpendicular to the principal face of the semiconductor layer 2 is a square, one side of which is about 7 μm. The planar shape of the source region 8 is a square, one side of which is 6 μm. The source region 8 is provided inside the body region 6 at an interval from the edge of the body region 6. Furthermore, the contact region 7 having a square planar shape is provided inside the source region 8. The distance A from the center of the contact region 7 to the source region 8 (the distance from the center of the contact region 7 to a vertex of the contact region 7) is 1 μm, for example. The respective regions are disposed so that, as viewed from a direction which is perpendicular to the principal face of the semiconductor layer 2, the directions in which the diagonals of the square contact region 7 extend coincide with the directions in which the four sides of the square body region 6 and source region 8 extend. The source region 8 surrounds the periphery of the contact region 7 with a predetermined interval therebetween, and a portion of the body region 6 is located in the region between the contact region 7 and the source region 8. This relative positioning holds true at any arbitrary depth (any depth in the range where the contact region 7 and the source region 8 are provided) of the semiconductor layer 2. Note that a gate length Lg, which is the distance between the end of the body region 6 and the end of the source region 8, is substantially uniform and is about 0.5 μm.

As shown in FIG. 3(b), the vertical MISFET has a structure in which unit cells 100 are integrated. The array pitch of the unit cells 100 is synonymous to the array pitch P of the body regions 6. Herein, the body regions 6 are arrayed along the row direction with a pitch P of 9.6 μm, and shifted along the row direction by a ½ pitch from row to row. As viewed from a direction which is perpendicular to the SiC layer 2, the distance B between adjoining body regions 6 is about 3 μm.

In the present embodiment, too, there is a possibility that misalignment may occur in a photolithography step after formation of the second mask layer, such that each contact region 7 may be formed in a position which is deviated from the design value. This problem will be described in detail below, with reference to FIG. 4(a) to (e). For simplicity, component elements similar to those in FIG. 1(a) to (h) will be denoted by like reference numerals, and the descriptions thereof will be omitted.

Figure 4:
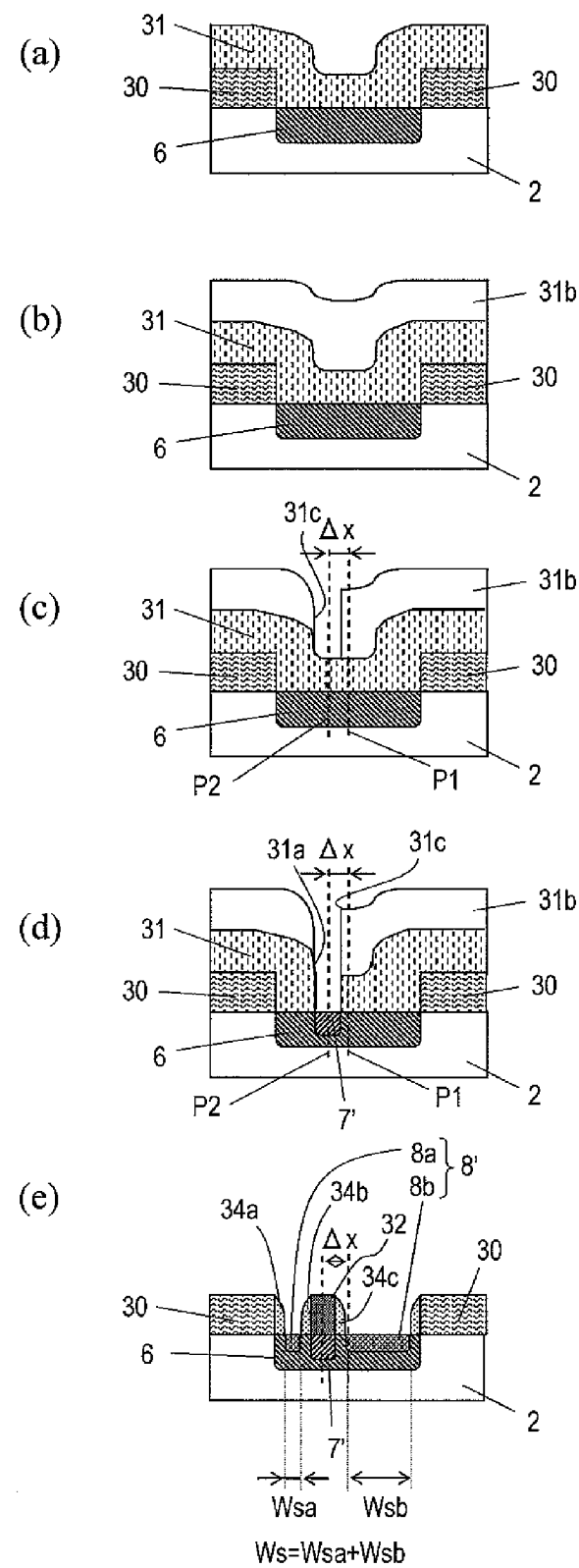
FIG. 4 (*a*) to (*e*) are diagrams for describing a case where a misalignment occurs in a photolithography step of the present embodiment so that the contact region 7 is formed in a position which is deviated from a design value.

After forming the body region 6 in the step shown in FIG. 1(a), as shown in FIG. 4(a), the second mask layer (which herein is an $SiO_2$ film) 31 is formed over the semiconductor layer 2 and the first mask layer 30. Next, as shown in FIG. 4(b), a resist film 31b is applied over the second mask layer 31. Thereafter, as shown in FIG. 4(c), the resist film 31b is patterned through a known exposure and development process, thereby forming an opening 31c in the resist film 31b. Next, as shown in FIG. 4(d), an etching is performed by using the resist film 31b as a mask, thereby forming the opening 31a in the second mask layer 31. Thereafter, an ion implantation of a p type impurity is performed by using the second mask layer 31, thereby forming a contact region 7' in the body region 6.

When performing the exposure and development of the resist film 31b in the step shown in FIG. 4(c), the opening 31c is positioned so that its center will be at a position P1. However, a misalignment may occur so that the center of the opening 31c is at a position P2 which is shifted from the position P1 by Δx, in which case the center of the opening 31a in the second mask layer 31 will also be at the position P2, as shown in FIG. 4(d). As a result of this, the center of the contact layer 7' will also be at the position P2.

If the opening 31a is placed at the position P2 in the step shown in FIG. 4(d), the third mask layer 32 will also be placed at the same position in the step of forming the source region 8 shown in FIG. 4(e). If an ion implantation is performed in this state by using the third mask layer 32 and a side wall 34b, 34c formed on its side face, the source region 8' will also be formed at a position which is shifted by Δx from the position where it should have been formed. Specifically, the right end of the source region 8a located on the left side of the contact region 7' will be formed at a position which is shifted by Δx, and the left end of the source region 8b located on the right side will be formed at a position which is shifted by Δx.

Figure 5:
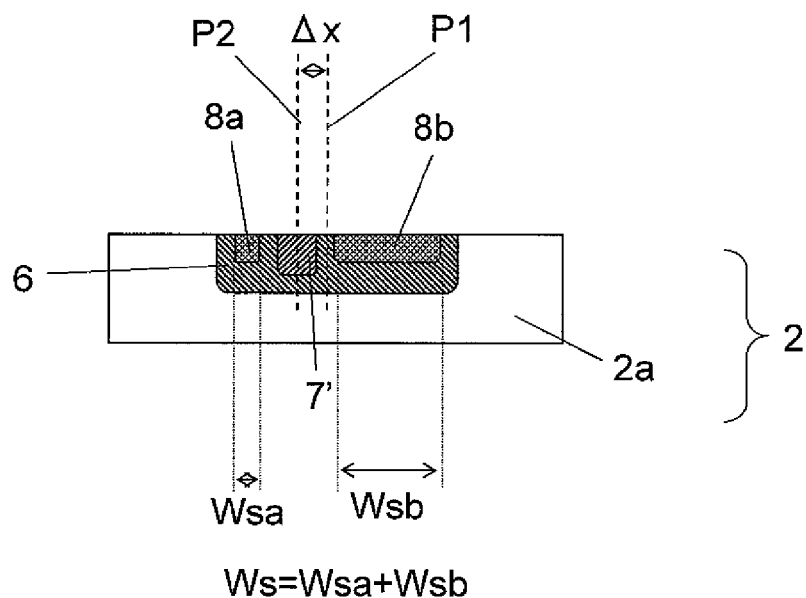
FIGS. 5 (*a*) and (*b*) are a cross-sectional view and a plan view showing a source region 8' and a contact region 7' in the case where a misalignment has occurred in the present embodiment.
Figure 5:
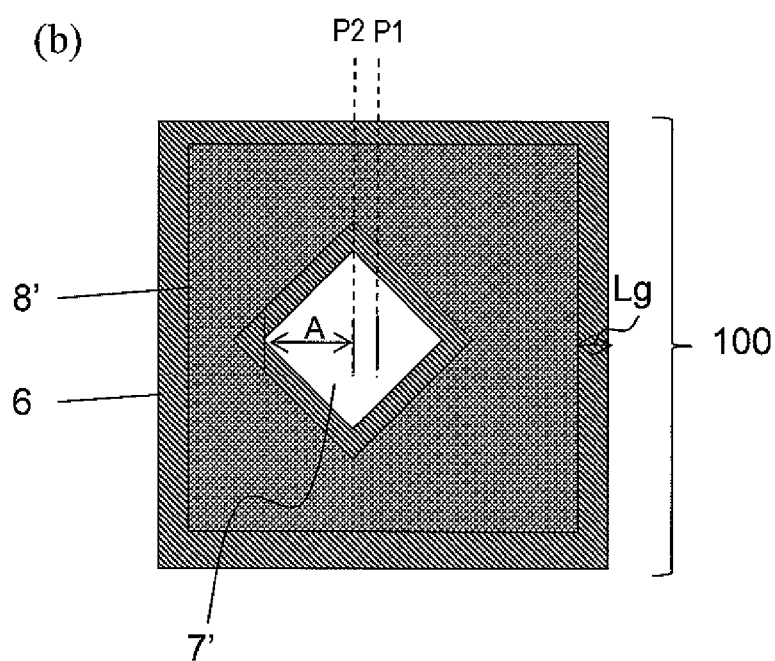

FIGS. 5(a) and (b) are a cross-sectional view and a plan view showing a source region 8' and a contact region 7' in the case where a misalignment has occurred in the present embodiment. As shown in FIGS. 5(a) and (b), according to the present embodiment, when a misalignment occurs, the contact region 7' and the source region 8' are shifted by the same distance and in the same direction from the center of the body region 6. Therefore, no overlap between the contact region 7' and the source region 8' occurs, so that a total of the width Wsa of the source region 8a on the left side of the contact region 7' and the width Wsb of the source region 8b on the right side is equal to a design width Ws of the source region 8.

Now, a case where the misalignment Δx has further increased will be described. If the misalignment Δx further increases, at the step shown in FIG. 4(e), the side walls 34a and 34b for forming the source region 8a may overlap each other. If an ion implantation is performed by using mutually overlapping side walls 34a and 34b, the source region 8a will not be formed. Thus, when the side walls 34a and 34b overlap each other, the width Wsb of the source region 8b may fluctuate depending on the degree of overlap, thus becoming deviated from the design width Ws of the source region 8. Therefore, the misalignment Δx preferably has a value within a range such that the side walls 34a and 34b do not overlap each other. So long as the side walls 34a and 34b do not overlap each other, the total of the width Wsa and the width Wsb will not change no matter how much misalignment Δx occurs, and thus the objective of the present invention will be attained. If the side walls 34a and 34b overlap each other, the source region 8a will not be formed, so that the gate length Lg (the distance between the end of the body region 6 and the end of the source region 8) will not be a constant value. Stated otherwise, when the gate length Lg has a constant value, there is no overlap between the side walls 34a and 34b, and therefore the total width of the source region will not change.

Therefore, it can be said that the objective of the present invention will be attained so long as the gate length Lg has a constant value.

Figure 6:
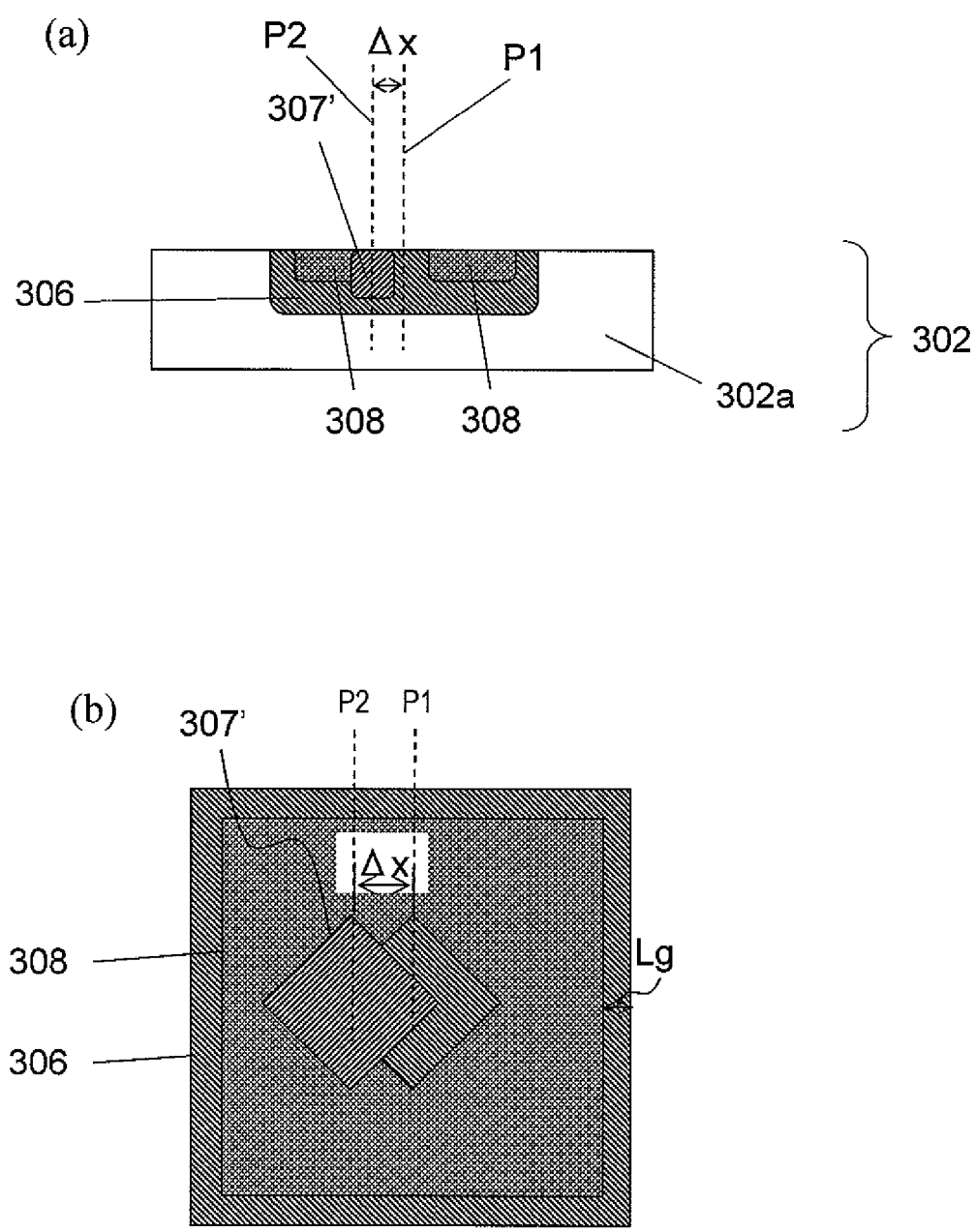
FIGS. 6 (*a*) and (*b*) are a cross-sectional view and a plan view showing a source region 8' and a contact region 7' in the case where a misalignment has occurred in a conventional example.

FIGS. 6(a) and (b) are a cross-sectional view and a plan view showing a source region 308 and a contact region 307' in the case where a misalignment has occurred in a conventional example. The structure shown in FIGS. 6(a) and (b) represents the structure of a semiconductor device which is formed by a method shown in FIG. 11(a) to (e). As shown in FIGS. 6(a) and (b), when a misalignment (Δx) occurs, the portion where the source region 308 and the contact region 307' overlap will no longer function effectively.

Figure 7:
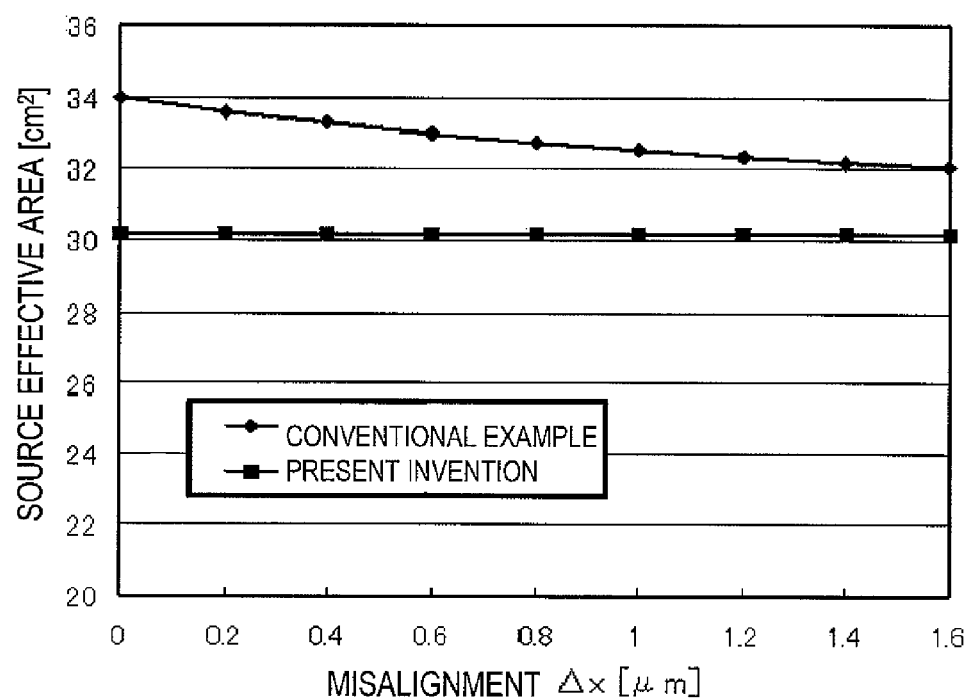
FIG. 7 A graph showing calculated values of an effective source region area ($\Delta z$) changing due to occurrence of a misalignment ($\Delta x$).

FIG. 7 shows calculated values of an effective source region area (Δz) changing due to occurrence of a misalignment (Δx). The conventional example shows calculated values in the case where the method disclosed in Patent Document 2 is used (shown in FIG. 11(a) to (e)). As shown in FIG. 7, in the conventional example, the effective area of the source regions 308 decreases as the misalignment (Δx) increases. On the other hand, according to the method of the present embodiment, the effective area of the source regions 8 does not change even if the misalignment increases. Thus, according to the present embodiment, increase in the contact resistance due to decrease of the effective area of the source regions 8 from the design value can be suppressed.

Although the above illustrates a case where the contact region 7' is deviated in the x direction, the same also applies when the contact region 7' is deviated in the −x direction, or the y direction or the −y direction, which are orthogonal to the x direction.

In the present embodiment, even if a misalignment occurs in a photolithography step, the openings (inner edges) of the contact region 7' and the source region 8' are shifted by the same distance and in the same direction. Therefore, the contact region 7' and the source region 8 do not overlap. This makes it possible to securely achieve contact of the body region 6, and prevent short-circuiting between electrodes and contact insufficiencies.

Moreover, since the effective areas of the source region 8 and the contact region 7' are not decreased, the ON resistance is not increased. Moreover, since variation in ON resistance due to misalignment is unlikely to occur between MISFET products, a high reliability is obtained.

Second Embodiment

Hereinafter, with reference to the drawings, a second embodiment of a semiconductor device according to the present invention will be described. By applying the fundamental concept of the first embodiment described above, various semiconductor devices can be produced. In the present embodiment, a method of producing an n channel-type vertical power MISFET composed of a multitude of unit cells by using SiC semiconductor will be described.

FIG. 8(a) to (e) and FIG. 9(a) to (d) are cross-sectional views showing production steps of a vertical MISFET of the present embodiment.

Figure 8:
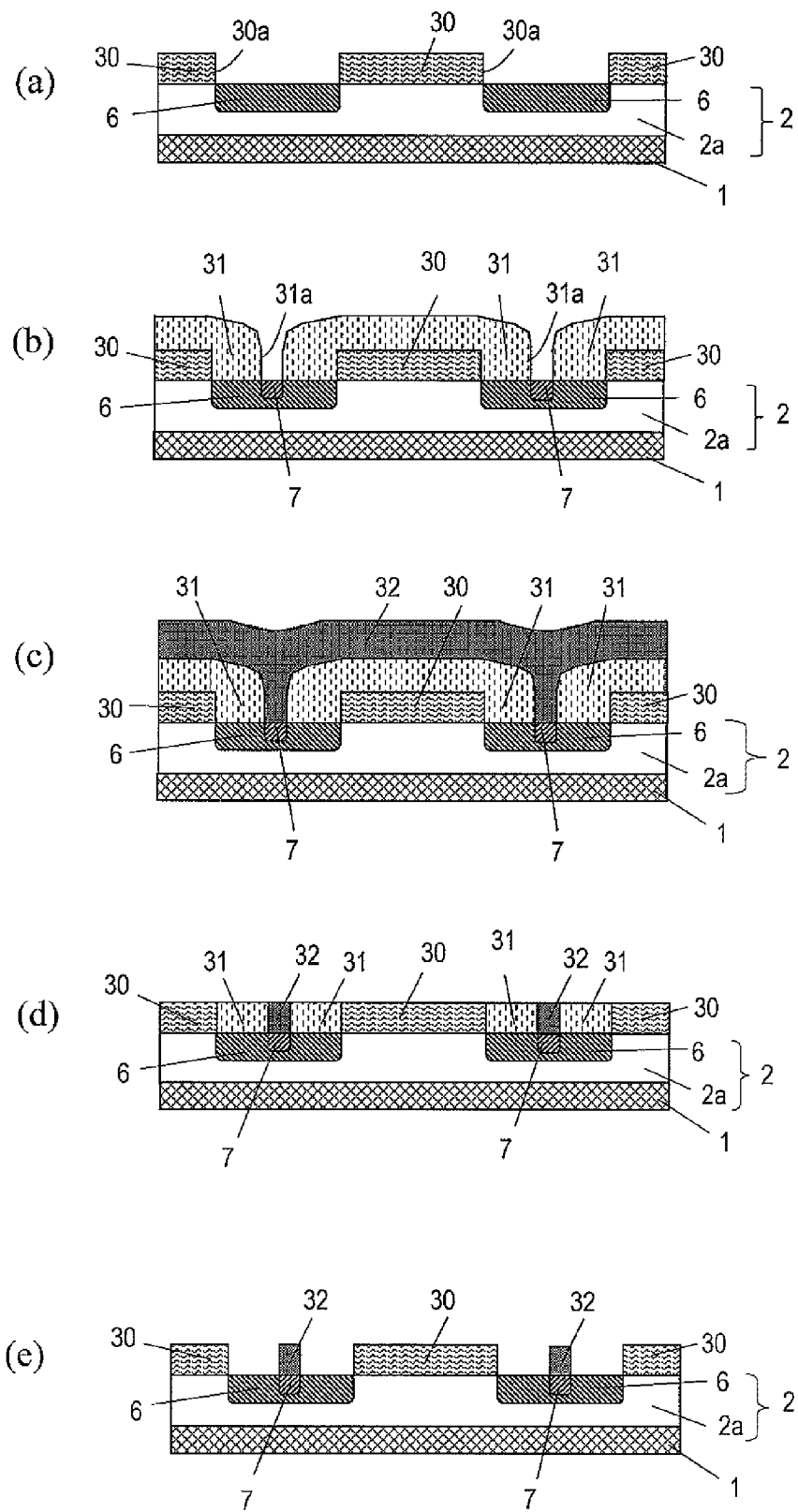
FIG. 8 (*a*) to (*e*) are cross-sectional views showing production steps of a vertical MISFET according to a second embodiment.

First, as shown in FIG. 8(a), a first mask layer 30 is provided on an SiC layer 2 which is grown on an SiC substrate 1. Herein, the first mask layer 30 is formed by using polycrystalline silicon (poly-Si), for example, and functions as an implantation mask for forming the body region. Herein, the first mask layer 30 is not limited to a poly-Si film.

As the SiC substrate 1, a 4H—SiC substrate having a diameter of 76 mm, whose principal face has an off angle of 8 degrees in the [11-20](1, 1, bar over 2, 0) direction from (0001) is used, for example. This SiC substrate has an n conductivity type and a carrier concentration of $7 \times 10^{18}$ cm$^{-3}$. Using a CVD technique, the SiC layer 2 can be formed by being epitaxially grown on the substrate while an in-situ doping of the n type impurity (which herein is nitrogen) is performed. The SiC layer 2 has a thickness of about 15 μm, and an impurity (nitrogen) concentration of about $5 \times 10^{15}$ cm$^{-3}$. As a buffer layer, an SiC layer containing an impurity at a higher concentration than that in the SiC layer 2 may be formed between the SiC substrate and the SiC layer 2. Note that the carrier concentration of the SiC substrate, and the thickness and impurity concentration of the SiC layer 2 are not limited to the above.

The first mask layer 30 is formed by, after depositing a poly-Si film on the SiC layer 2, patterning these films by using known photolithography and etching. The resultant first mask layer 30 has openings 30a that define regions to become body regions of the SiC layer 2. Note that the material composing the first mask layer 30 is to be appropriately selected in view of the etching selectivity ratio with respect to a mask layer to be used in a subsequent step.

Next, from above the first mask layer 30, implantation of p type impurity ions is performed in the SIC layer 2. As a result, p type body regions (depth d: e.g. 1.5 μm to 2 μm) 6 are formed in the regions of the SiC layer 2 where the impurity ions have been implanted. The remaining region of the SiC layer 2 where the impurity ions have not been implanted becomes an n type drift region 2a. Note that the depth of the p type body region 6 is not limited thereto.

In the present embodiment, aluminum ions are used as the p type impurity ions. Herein, the implantation of aluminum ions is performed in multiple steps while varying the energy, and the maximum energy at the implantation may be about 350 keV, for example. Since the diffusion coefficient of impurity is small in a semiconductor material such as SiC, the depth d of the body regions 6 is determined by the depth into the SiC layer 2 at which the aluminum ions are implanted. Therefore, the energy at implantation is to be appropriately selected depending on the depth d of the body regions 6 to be formed. The substrate temperature at ion implantation may be adjusted in the range from 100° C. to 500° C., or may be room temperature.

Next, as shown in FIG. 8(b), a second mask layer 31 is formed over the SiC layer 2 and the first mask layer 30. Herein, the second mask layer 31 is formed by using an SiO$_2$ film, and is used as an implantation mask for forming contact regions. After forming the second mask layer 31, a resist film (not shown) covering the substrate surface is applied. Thereafter, the resist film is patterned through a known exposure and development process, and by using known etching, a mask layer is formed which has openings 31a in portions of the body region 6 where contact regions are to be formed. Since a step of conducting an etching to selectively remove the second mask layer 31 while leaving the first mask layer 30 is to be performed later, a material having a different etching selectivity ratio from that of the first mask layer is used for the second mask layer 31. The material composing the second mask layer 31 is not limited to an SiO$_2$ film.

Thereafter, by using the second mask layer 31, p type impurity ions (e.g. aluminum ions) are implanted into the SiC layer 2 in multiple steps, whereby p$^+$ type contact regions 7 are obtained.

Next, as shown in FIG. 8(c), a third mask layer 32 is formed over the SiC layer 2 and the second mask layer 31. Herein, the third mask layer 32 is formed by using an SiN film. Since a step of conducting an etching to selectively remove the second mask layer 31 while leaving the third mask layer 32 is to be performed later, a material having a different etching selectivity ratio from that of the second mask layer 31 is used for the third mask layer 32. The material composing the third mask layer 32 is not limited to an SiN film.

Next, as shown in FIG. 8(d), through a known CMP step, portions of the second mask layer 31 and the third mask layer 32 that are located above the upper face of the first mask layer 30 are removed. Herein, the method of removing portions of the second mask layer 31 and the third mask layer 32 may be any method that is capable of selectively removing portions located above the upper face of the first mask layer 30, without being limited to CMP.

Next, as shown in FIG. 8(e), the second mask layer 31 is selectively removed by using a known etchant such as dilute hydrofluoric acid, thereby exposing portions of the surface of the body region 6. The first mask layer 30 and the third mask layer 32 are not removed through this etching, but remain on the surface of the semiconductor layer 2.

Figure 9:
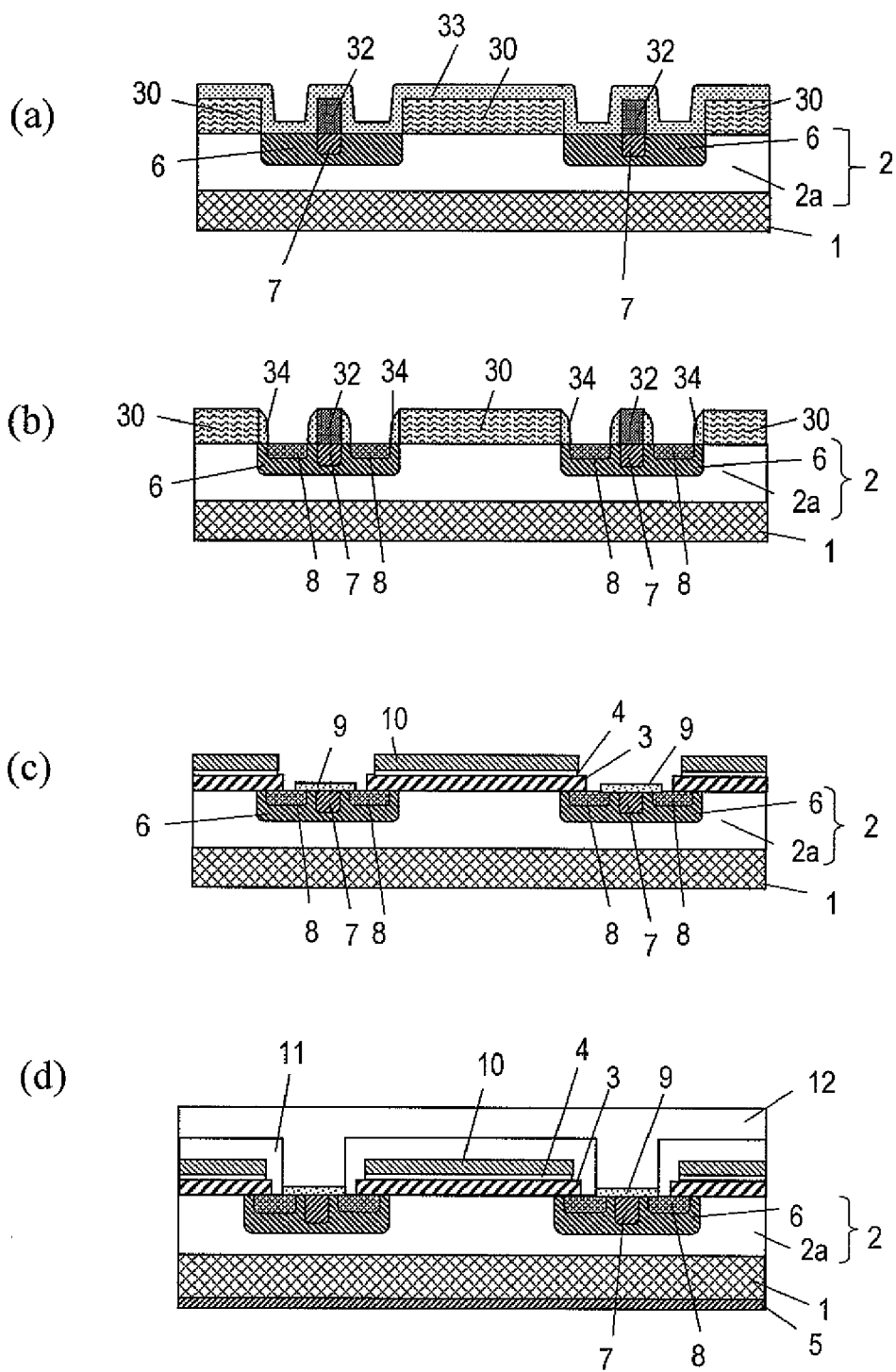
FIG. 9 (*a*) to (*d*) are cross-sectional views showing production steps of the vertical MISFET according to the second embodiment.
Figure 10:
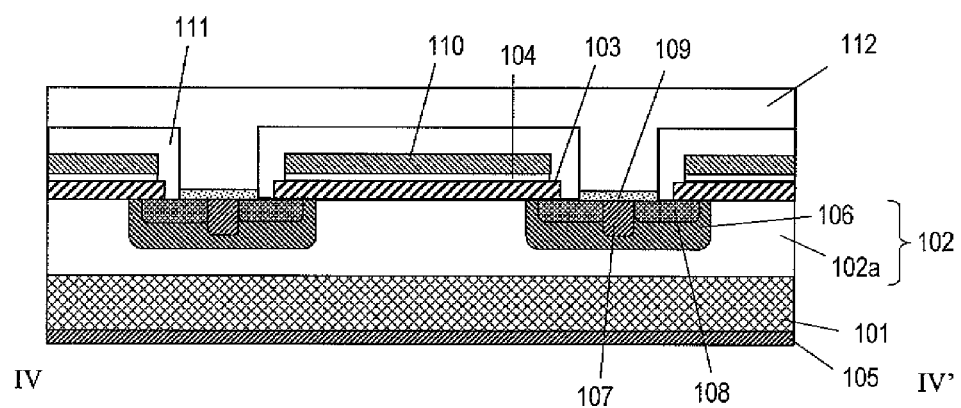
FIG. 10 A cross-sectional view illustrating an exemplary vertical MISFET.
Figure 11:
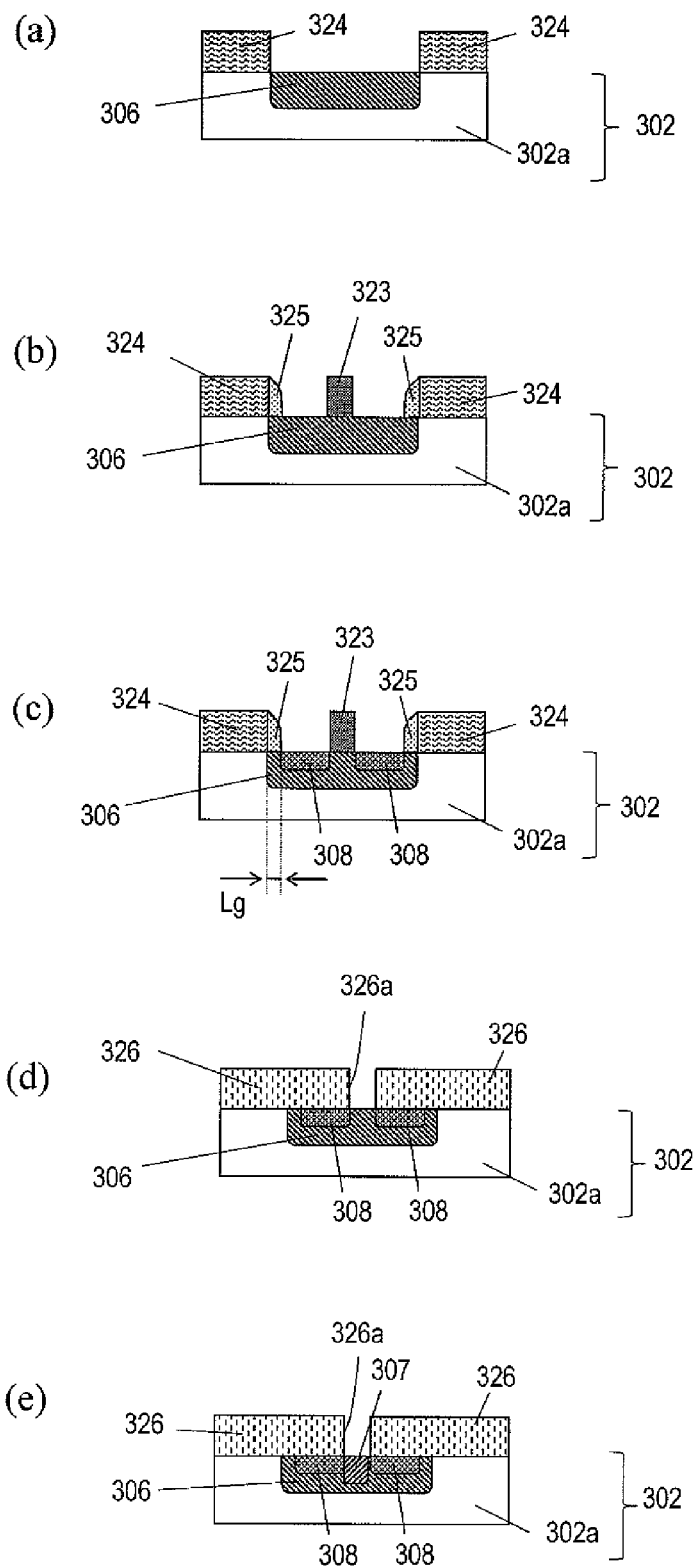
FIG. 11 (*a*) to (*e*) are cross-sectional views showing production steps of a vertical MISFET which is disclosed in Patent Document 2.
Figure 12:
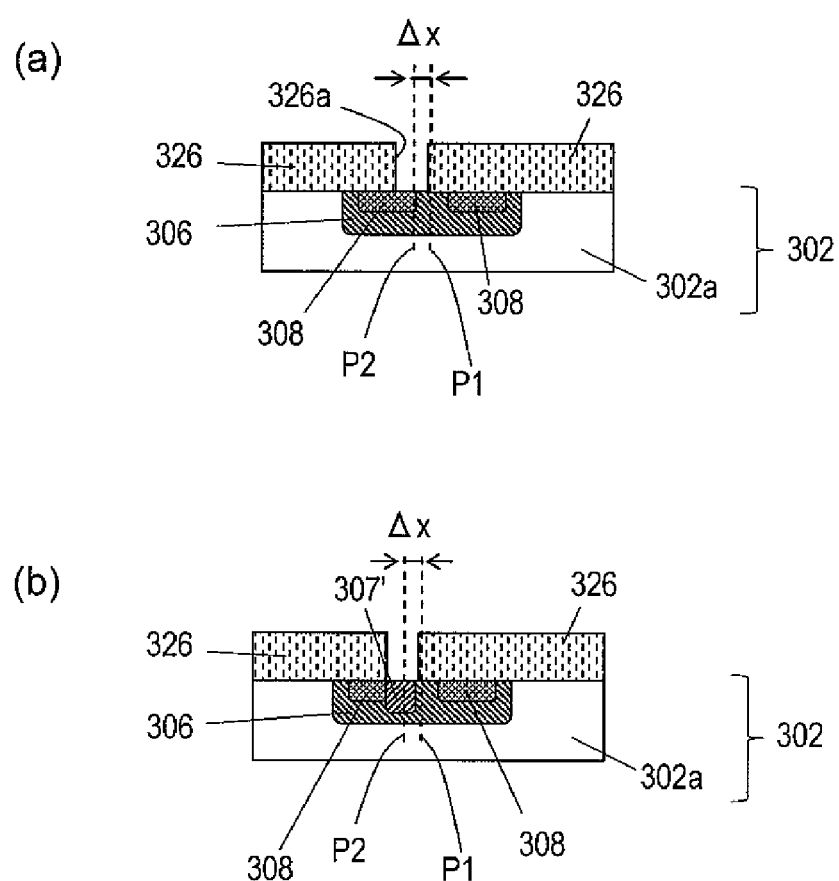
FIGS. 12 (*a*) and (*b*) are diagrams for describing a case where a misalignment has occurred in the method shown in FIG. 11(*a*) to (*e*).

Next, as shown in FIG. 9(a), a sidewall-forming film 33 composed of an SiO$_2$ film or the like is deposited so as to cover the first mask layer 30 and the third mask layer 32. Herein, the sidewall-forming film 33 is not limited to an SiO$_2$ film.

Next, as shown in FIG. 9(b), the deposited sidewall-forming film 33 is etched back through known dry etching using a gas such as CHF$_3$, thereby forming side walls (width: e.g. 0.5 μm) on the lateral walls of the first mask layer 30 and the third mask layer 32. Thereafter, by using the first mask layer 30, the third mask layer 32, and the side walls 34 as implantation masks, n type impurity ions (e.g. nitrogen ions or phosphorus ions) are implanted into the semiconductor layer 2, thereby forming source regions 8 (depth: e.g. 0.5 μm to 1 μm) inside the body regions 6. According to this method, there will be no overlap between the source regions 8 and the contact regions 7, so that, even if a misalignment occurs, the width of the source region 8 will be equal to the design width of the exposure mask. Note that the depth of the source region 8 is not limited thereto.

Next, by using known etching, the first mask layer 30, third mask layer 32, and the side walls 34 are completely removed.

Next, in order to activate the impurity ions having been implanted into the SiC layer 2, an activation anneal is performed at a temperature of no less than 1500° C. and no more than 1800° C., for example. For example, after annealing, the impurity concentration in the body regions 6 is $2 \times 10^{18}$ cm$^{-3}$, the impurity concentration in the source regions 8 is $5 \times 10^{19}$ cm$^{-3}$, and the impurity concentration in the contact regions 7 is $5 \times 10^{19}$ cm$^{-3}$. However, in the case where the subsequently-described channel layer is not be formed, in order to control the threshold value, it is preferable to lower the impurity concentration near the face of each body region 6 that is in contact with the gate insulating film than in any other portion (e.g. to an impurity concentration of about $1 \times 10^{17}$ cm$^{-3}$). The impurity concentrations in the body regions 6, the source regions 8, and the contact regions 7 are not limited thereto.

Next, as shown in FIG. 9(c), a channel layer 3, a gate insulating film 4, gate electrodes 10, and source electrodes 9 are formed by known methods.

By using a CVD technique, the channel layer 3 can be formed by epitaxially growing SiC on the entire face of the SiC layer 2 while performing in-situ doping of an impurity (nitrogen), and thereafter patterning the resultant SiC growth layer. The channel layer 3 is formed over a portion of each source region 8, a portion of each body region 6 that surrounds the periphery of the source region 8, and a portion of the drift region 2a located outside the body regions 6. Preferably, no channel layer 3 is formed in the regions where the source electrodes 9 are to be formed, on the surface of the SiC layer 2. The channel layer 3 has a thickness of about 0.2 μm and an average impurity concentration of about $1\times10^{17}$ cm$^{-3}$. Forming the channel layer 3 through epitaxial growth can improve the surface planarity of the channel portions, thus providing an advantage of improving the channel mobility and facilitating control of the threshold value. Note that, the thickness and impurity concentration of the channel layer 3 are not limited to the above.

The gate insulating film 4 is formed by subjecting the surface of the channel layer 3 to thermal oxidation, and has a thickness of about 0.07 μm. Since an oxide film is also formed on the rear face of the substrate in this thermal oxidation process, this oxide film is removed after the thermal oxidation process. The gate electrodes 10 can be formed by depositing a poly-Si film on the surface of the gate insulating film 4 and patterning it. As shown in the figure, via the channel layer 3, the gate insulating film 4 and each gate electrode 10 cover over the interior of one body region 6 and the interior of an adjoining body region 6, across the drift region 2a between the body regions. Note that the thickness of the gate insulating film 4 is not limited to the above. A combination of a thermal oxide film and a deposited insulative film may also be used.

Each source electrode 9 forms an ohmic contact with a source region 8 and a contact region 7. Such source electrodes 9 can be obtained by forming a titanium metal layer so as to be in contact with the source region 8 and the contact region 7, and thereafter performing a heat treatment at about 950° C., for example.

Next, as shown in FIG. 9(d), an interlayer insulating film 11 covering the gate electrodes 10 is formed by a known method. As the interlayer insulating film 11, an SiO$_2$ film can be used, for example. The interlayer insulating film 11 may be formed after forming the source electrodes 9 as in the above-described method, or the interlayer insulating film 11 may be formed and then the source electrodes 9 may be provided in contact holes which are formed in the interlayer insulating film 11.

Thereafter, upper wiring 12 which is in contact with the source electrodes 9 is formed in contact holes that are formed in the interlayer insulating film 11.

Moreover, by depositing a titanium metal layer on the rear face of the SiC substrate 1 and performing a heat treatment similar to that for forming the source electrodes 9, a drain electrode 5 is formed. Through the above steps, a vertical MISFET can be formed.

In the present embodiment, even if a misalignment occurs in the photolithography step, the openings (inner edges) of each contact region 7 and each source region 8 are shifted by the same distance and in the same direction. Therefore, no overlap between the contact region 7 and the source region 8 occurs. This makes it possible to securely achieve contact of the body regions 6, and prevent short-circuiting between electrodes and contact insufficiencies.

Moreover, since the effective areas of the source regions 8 and the contact regions 7 are not decreased, the ON resistance is not increased. Moreover, since variation in ON resistance due to misalignment is unlikely to occur between MISFET products, a high reliability is obtained.

In the above embodiments, the first mask layer, the second mask layer, the third mask layer, the side walls, the semiconductor layer (SiC layer), the body region, the contact region, the source region, the channel layer, the source electrode, the upper wiring, and the drain electrode respectively correspond to a first implantation mask layer, a second implantation mask layer, a third implantation mask layer, a fourth implantation mask layer, a first semiconductor layer, a second conductivity-type semiconductor region, a second conductivity type high-concentration region, a first conductivity-type semiconductor region, a second semiconductor layer, an electrically conductive layer, an upper wiring electrode, and a rear electrode according to the present invention.

Although preferable embodiments of the present invention have been described in terms of the first and second embodiments, a "semiconductor device" as used in the present specification broadly encompasses semiconductor devices such as vertical MISFETs and insulated gate bipolar transistors (hereinafter referred to as IGBTs). There is no particular limitation as to the semiconductor layers, and they may be silicon (Si), gallium arsenide (GaAs), or wide band gap semiconductors having greater band gaps, e.g., silicon carbide (SiC) and gallium nitride (GaN).

Although the present embodiment has been illustrated by taking an n channel-type MISFET as an example, similar effects will also be obtained in a p channel-type MISFET.

Although a MISFET is produced by using an SiC semiconductor substrate of a predetermined conductivity type and allowing an SiC growth layer of the same conductivity type to be epitaxially grown thereon, the effects of the present invention can also be obtained by producing an IGBT by a method of using an SiC semiconductor substrate of a different conductivity type from that of the SiC growth layer.

Although a substrate whose principal face is a 4H—SiC (0001) off plane is used, a substrate whose principal face is a plane other than the 4H—SiC(0001) off plane may also be used, or an SiC substrate of a polytype other than 4H—SiC may be used. Furthermore, a semiconductor material other than SiC may be used.

The channel layer 3 according to the present embodiment may be a single epitaxial layer, or have a structure including multiple layers of different impurity concentrations. However, the impurity concentration of the channel layer 3 is preferably selected so that it is substantially depleted with the potential difference between the gate electrode 10 and the source electrode 9 being zero volts.

Although the channel layer 3 in the present embodiment is an epichannel layer which is formed through epitaxial growth, an implanted channel layer may be formed through ion implantation into the SiC layer 2. Alternatively, without forming the channel layer 3, a channel (inversion layer) may be formed in a surface region of the body region 6 in between the drift region 2a and each source region 8 by applying a gate voltage.

Furthermore, although a MISFET is produced by using the SiC substrate 1 of the same conductivity type as that of the SiC layer 2 in the above embodiments, an IGBT may be produced by using an SiC substrate of a different conductivity type from that of the SiC layer 2. In the case of producing an IGBT, too, as in the method described in the above embodiments, utilizing a self-alignment process after forming the body regions (well regions) makes it possible to suppress misalignment between each source region (emitter region or collector region) and each contact region and reduce changes in the areas of the source regions and the source electrodes (emitter electrodes or collector electrodes), thereby reducing the ON resistance and decrease in the ON current.

Although the present invention has been described with respect to preferred embodiments, such descriptions do not constitute limitations, and various modifications are possible.

INDUSTRIAL APPLICABILITY

Since the present invention makes it possible to suppress deterioration and variation in device characteristics through a simple process which is suitable for mass production, the present invention is broadly applicable to vertical semiconductor devices such as vertical MISFETs and IGBTs, as well as devices incorporating such semiconductor devices.

REFERENCE SIGNS LIST

| | |
|---|---|
| 1 | SiC substrate |
| 2 | SiC layer |
| 2a | drift region |
| 3 | channel region |
| 4 | gate insulating film |
| 5 | drain electrode |
| 6 | body region |
| 7, 7' | contact region |
| 8, 8', 8a, 8b | source region |
| 9 | source electrode |
| 10 | gate electrode |
| 11 | interlayer insulating film |
| 12 | upper wiring |
| 30 | first mask layer |
| 33 | sidewall-forming film |
| 31 | second mask layer |
| 32 | third mask layer |
| 34, 34a, 34b, 34c, 34A | side wall |
| 40 | resist mask |
| 100 | unit cell |

The invention claimed is:

1. A method of producing a semiconductor device, comprising:
   step (a) of implanting an impurity of a second conductivity type into a first semiconductor layer of a first conductivity type by using a first implantation mask layer, thereby forming a second conductivity-type semiconductor region in a surface region of the first semiconductor layer;
   step (b) of forming a second implantation mask layer covering the first implantation mask layer and the first semiconductor layer and having an opening for exposing a portion of the second conductivity-type semiconductor region, and implanting an impurity of the second conductivity type by using the first implantation mask layer and the second implantation mask layer, thereby forming within the second conductivity-type semiconductor region a second conductivity type high-concentration region having a higher concentration than an impurity concentration in the second conductivity-type semiconductor region;
   step (c) of forming a third implantation mask layer burying the opening, and thereafter selectively removing the second implantation mask layer;
   step (d) forming a fourth implantation mask layer on a side face of the first implantation mask layer and a side face of the third implantation mask layer;
   step (e) of implanting an impurity of the first conductivity type by using the first implantation mask layer, the third implantation mask layer, and the fourth implantation mask layer, thereby forming a first conductivity-type semiconductor region within the second conductivity-type semiconductor region; and
   step (f) of forming an electrically conductive layer in contact with the first conductivity-type semiconductor region and the second conductivity type high-concentration region, wherein,
   at step (e), the first conductivity-type semiconductor region is formed so as to surround the second conductivity type high-concentration region at an interval from an outer periphery of the second conductivity-type semiconductor region at any arbitrary depth of the first semiconductor layer, the method further comprising
   a step of, before step (e), removing the fourth implantation mask layer formed on the side face of the third implantation mask layer.

2. The method of producing a semiconductor device of claim 1, wherein, at step (d), side walls are formed on the side faces of the first implantation mask layer and the third implantation mask layer as the fourth implantation mask layer.

3. The method of producing a semiconductor device of claim 1, wherein the first, second, and third implantation mask layers are composed of respectively different materials.

4. The method of producing a semiconductor device of claim 1, further comprising:
   step (g) of, before step (a), forming the first semiconductor layer on a semiconductor substrate;
   step (h) of forming a second semiconductor layer on a portion of the first conductivity-type semiconductor region, a portion of the second conductivity-type semiconductor region that surrounds a periphery of the first conductivity-type semiconductor region, and a portion of the first semiconductor layer that is located outside the second conductivity-type semiconductor region;
   step (i) of forming a gate insulating film on the second semiconductor layer;
   step (j) of forming a gate electrode on the gate insulating film;
   step (k) of forming an upper wiring electrode to be electrically connected to the electrically conductive layer; and
   step (l) of forming a rear electrode on a rear face of the semiconductor substrate.

5. The method of producing a semiconductor device of claim 1, wherein, at step (d), after forming a mask-making film covering the first implantation mask layer and the third implantation mask layer, anisotropic etching is performed for the mask-making film to form the fourth implantation mask layer while leaving only portions of the mask-making film that are located on the side face of the first implantation mask layer and the side face of the third implantation mask layer.

6. The method of producing a semiconductor device of claim 1, wherein the first semiconductor layer is made of silicon carbide.

* * * * *